United States Patent [19]

Griffin

[11] 4,166,667

[45] Sep. 4, 1979

[54] CIRCUIT BOARD CONNECTOR

[75] Inventor: Wendell L. Griffin, Warren, Pa.

[73] Assignee: GTE Sylvania, Incorporated, Stamford, Conn.

[21] Appl. No.: 893,361

[22] Filed: Apr. 17, 1978

[51] Int. Cl.$^2$ .......... H05K 1/07

[52] U.S. Cl. .......... 339/176 MP; 339/221 R

[58] Field of Search .......... 339/17 C, 17 CF, 220 R, 339/221 R, 221 M, 176 MP

[56] References Cited

U.S. PATENT DOCUMENTS

| | | | |
|---|---|---|---|
| 2,497,484 | 2/1950 | Wood | 339/221 R |
| 3,223,960 | 12/1965 | Ruehlemann | 339/221 |
| 3,579,178 | 5/1971 | Travis | 339/221 R |
| 3,611,259 | 10/1971 | Palecek | 339/176 MP |
| 3,670,294 | 6/1972 | Johnson et al. | 339/221 |
| 3,753,211 | 8/1973 | Pauza et al. | 339/17 CF |
| 3,761,871 | 9/1973 | Teurlings | 339/221 R |
| 3,764,955 | 10/1973 | Ward | 339/176 MP |
| 3,783,433 | 1/1974 | Kurtz et al. | 339/17 C |
| 3,997,233 | 12/1976 | Evans | 339/97 C |
| 4,017,143 | 4/1977 | Knowles | 339/221 R |
| 4,089,104 | 5/1978 | Barry et al. | 29/626 |
| 4,089,581 | 5/1978 | Schwindt | 339/176 MP |

FOREIGN PATENT DOCUMENTS

| | | | |
|---|---|---|---|
| 1435375 | 5/1976 | United Kingdom | 339/17 CF |

*Primary Examiner*—Neil Abrams

*Attorney, Agent, or Firm*—Robert E. Walter

[57] ABSTRACT

A connector for a circuit board includes a mounting member having a plurality of apertures therein. The electrical contacts each have a flat contact portion at one end, an arcuate portion at the other end, and an intermediate portion having an expanded section positioned within respective apertures for securing the contact to the mounting member.

8 Claims, 6 Drawing Figures

CIRCUIT BOARD CONNECTOR

BACKGROUND OF THE INVENTION

The present invention relates a device for mechanically and electrically connecting circuit boards. One board, sometimes referred to as the mother board, is the type having a plurality of openings coated with an electrically conductive material. The other board, referred to as the daughter board, has a plurality of conductive pads on the marginal portions thereof.

Contacts which are formed from an electrically conductive material have one end adapted for insertion within the cladded bores of the mother board. The other end generally includes a flat portion for contacting the pads on the daughter board which is often mounted in a plane perpendicular to the plane of the mother board.

In prior art systems, such as described in U.S. Pat. No. 3,783,433 to Kurtz, the contacts are individually press fitted into the copper clad holes in the circuit board. With this method of construction, cantilever forces generated by insertion of the daughter board are transmitted to the cladding about the holes thus resulting in deterioration of the mechanical holding power and electrical continuity.

U.S. Pat. No. 3,764,955 to Ward, relates to a mounting bar for holding individual electrical contacts that are arranged along the outer perimeter of the bar within notches. The notches are deformed after insertion of the contact to firmly hold the contact in place. Removal of defective contacts causes damage to the mounting bar. Hence, replacement of defective contacts with new contacts is difficult.

SUMMARY OF THE INVENTION

Heretofore, a connector has not been provided which permits accurate alignment of contacts in the holes of a circuit board while firmly securing the contacts to a mounting member so as to permit convenient replacement of defective contacts without damage to either the circuit board or mounting member.

In accordance with the present invention there is provided an electrical connector for a circuit board comprising a mounting member having a plurality of apertures therein, each aperture having an interior surface, a plurality of electrical contacts, each contact including a flat contact portion at one end, an arcuate portion of the other end and an intermediate portion having terminal edge portions sprung outwardly and abutting the interior surface of an aperture for securing said contact to said mounting member.

Also provided is an electrical contact and circuit board assembly comprising a mounting member having a plurality of apertures therein, said apertures lying within a substantially common first plane, each aperture having an interior surface, a plurality of electrical contacts, each contact including a flat contact portion at one end, an arcuate portion at the other end and an intermediate portion having terminal edge portions sprung outwardly and abutting the interior surface of an aperture for securing said contact to said mounting member, a circuit board having a plurality of holes therein and lying within a substantially common second plane, at least a portion of said holes having an electrically conductive material coated on the inner surface thereof, said first and second planes being substantially parallel, said arcuate portion of said contacts being disposed in said holes.

DETAILED DESCRIPTION OF THE INVENTION

Figure 1:
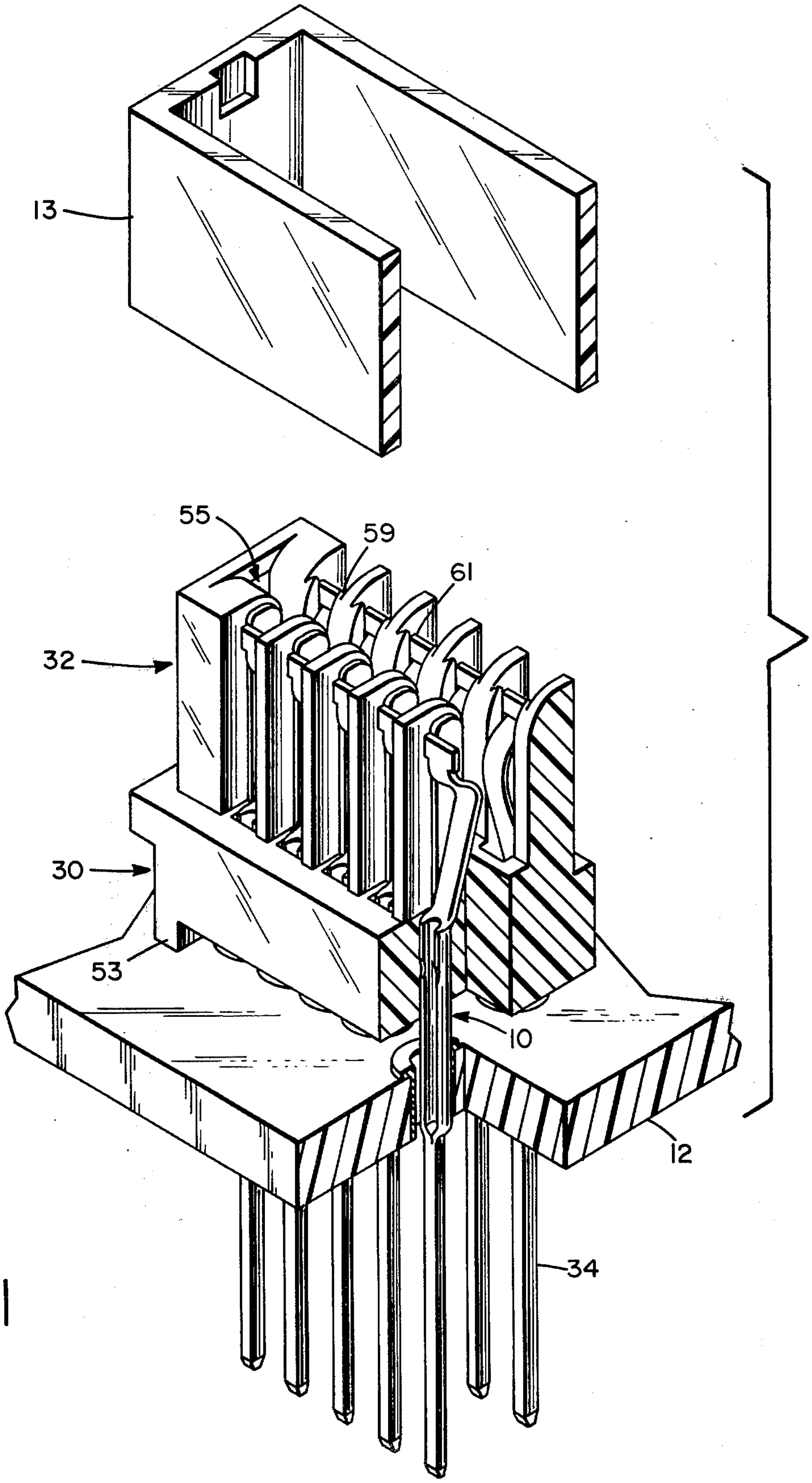
FIG. 1 is a perspective view showing a partial section of the connector as mounted to the circuit board.
Figure 2:
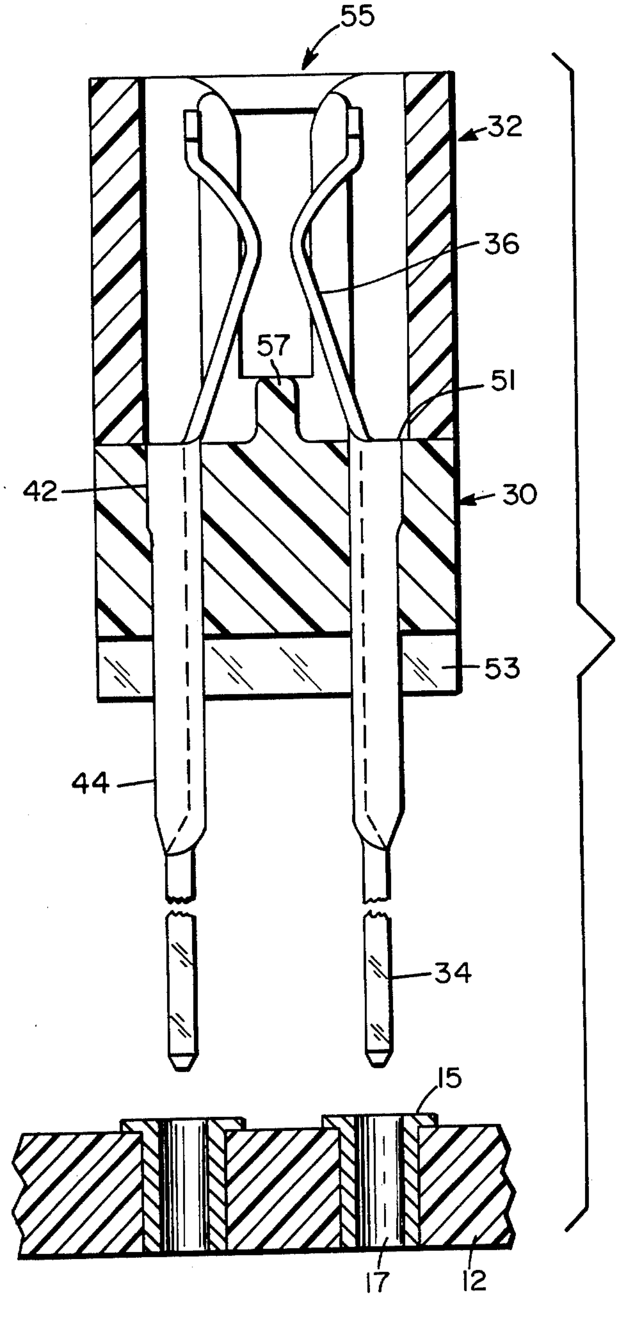
FIG. 2 is a side elevation of the connector and circuit board.

Referring to FIG. 1, the printed wiring board shown at 12 comprises a substrate having a plurality of holes or bores 17 located therein. The holes 17 lie in a substantially common plane and are clad in copper or other electrically conducting material 15. Generally the conductive coating 15 overlaps each end of the holes 17 and is spread over the surface for providing improved electrical contact. Strips are placed on the board and connected to selected plated through holes. This arrangement allows the interconnection between the various holes 17. The holes 17 are generally arranged in a particular preset array, parallel rows and staggered rows are the most common.

So as to properly align contacts 10 for insertion into the holes 17 of the circuit board 12, a mounting member 30 is provided. The mounting member 30 includes a plurality of rectangular apertures 51 which are arranged in an array to match the array of holes 17 in the circuit board 12. Each of the contacts 10 are fixedly held to the mounting board 30 at the apertures 51. Leg portions 53 depend from the lower surface of the mounting member 30 to support and locate the mounting member 30 above the surface of the printed circuit board 12. The leg portions 53 are spaced so that they contact the circuit board 12 in the insulating areas between the holes 17. The final connector assembly is shown in FIG. 1. The apertures 51 lie substantially in a common axial plane that is spaced from the plane of holes 17 of the circuit board.

A plurality of electrical contacts 10 are arranged in a predetermined array on the mounting member 30 with flat portions or fingers 36 of opposite contacts 10 facing each other. The flat portion 36 is bent inwardly to form a contact portion and bent outwardly near the end. A circuit board (not shown) of the type having conductive strips or pads on the marginal portions may be inserted between opposing fingers 36 which are aligned in parallel rows. The flat portions 36 wipe against the conductive strips as the board is forced between opposite electrical contacts 10. This motion causes the flat portion 36 to yield outwardly due to its resilience for generating holding forces which serve to hold the board in place and establish electrical continuity with conductive strips thereon.

Guide member 32 is of an insulating material and formed to fit over to adjacent rows of electrical contacts 10. The guide member 32 can be a separate member or formed as an integral part of the mounting member 30 as shown in the drawings. A cover 13 is provided for the guide 32. The guide 32 includes a longitudinally extending slot 55 for accommodating a lower portion of a board when it is inserted into the slot 55 in a direction normal to the plane of the mounting member 30. A stop 57 is provided within the longitudinal slot 55 for preventing further downward movement of an inserted daughter board (not shown). The guide member 32 is also provided with T-shaped surfaces 59 with the top surfaces of the T terminating inwardly. The flat portions 36 include tabs 61 located between shoulders of the T-shaped surface 30. The tabs 61 prevent the flat portions 36 from extending inwardly. Due to the leaf spring construction of the flat portions 36 the contact is biased inwardly and flexes outwardly when contact is made with an inserted circuit board.

Figure 4:
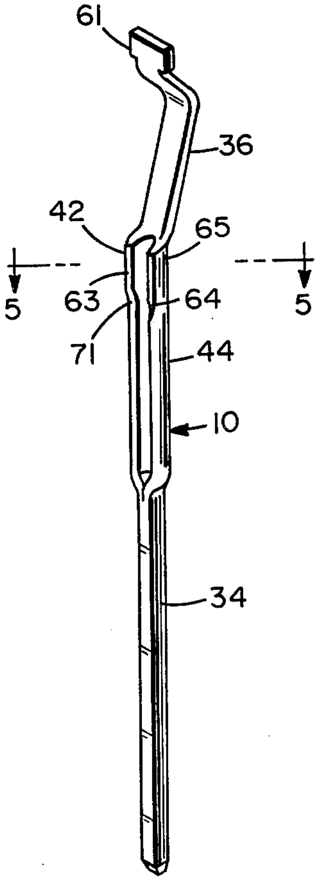
FIG. 4 is a perspective view of the contact.
Figure 3:
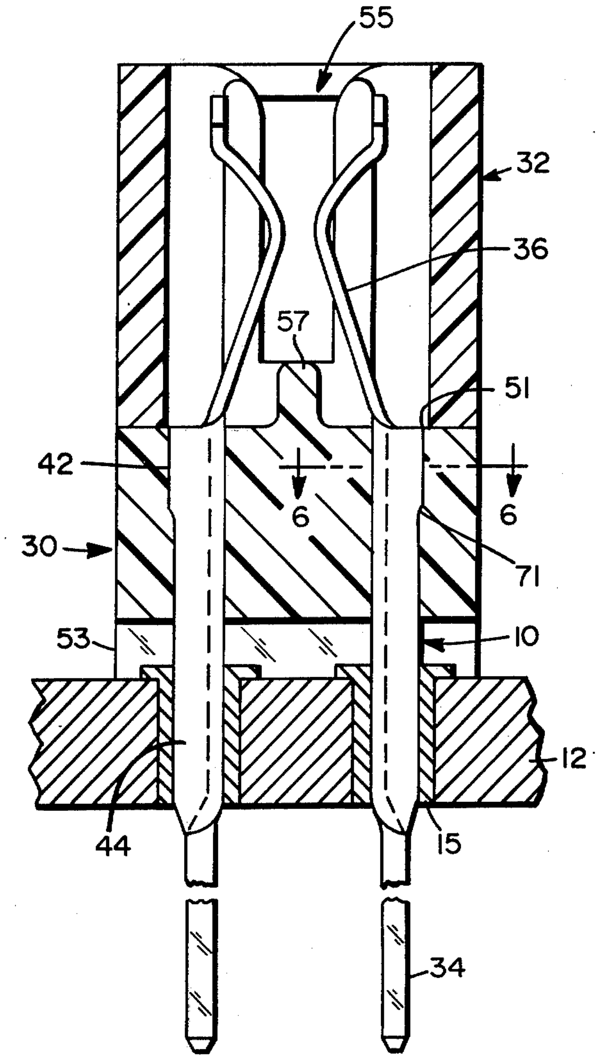
FIG. 3 is a side elevation of the assembled connector and circuit board.

As shown in FIG. 4, each of the electrical contacts 10 includes a flat protion 36 at one end as hereinbefore discussed, an arcuate portion 44, and an intermediate portion 42 for deformably retaining the contact 10 within the apertures 51. Tail portions 34 depend from the arcuate portion 44.

The intermediate portion 42 includes terminal edge portions 63. The edge portions 63 are joined by a non-linear central portion which forms a projecting portion 65. Preferably the projecting portion 65 is arcuate with side walls terminating in respective edge portions 63.

Figure 5:
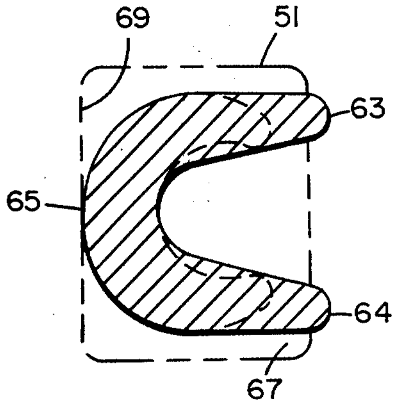
FIG. 5 is a cross-sectional view along 6—6 prior to insertion of the contacts into the plated hole.
Figure 6:
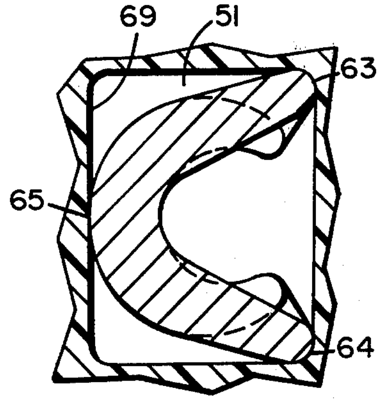
FIG. 6 is a cross-sectional view along 6—6.

The rectangular aperture 51 includes an interior surface with corners 67 facing an interior wall 69. The dimension between the corners 69 is less than the dimension between the terminal edge portions 63, 64. As the intermediate portion 42 is inserted into the aperture 51, the edge portions 63, 64 flex or are sprung outwardly to accommodate the corners 67 of the aperture 51. FIG. 5 shows the accurate portion after insertion into 15. FIG. 6 illustrates the intermediate portion after insertion. The intermediate portion 42 expands along its lengthwise dimension as mentioned between edge portions 63. The widthwise dimension between the projecting portion 65 and the plane connecting the terminal end portions 63, 64 compresses during insertion. This latter dimension is larger than the corresponding dimension between the interior wall 69 and its opposing wall. The dimension of the non-linear section from one of the terminal edge portions 63, 64 to the projection portion 65 and to the other terminal portion 63 corresponds to the dimension from one corner 67 to a point on the wall 69 to the other of the corners 67 of the rectangular aperture 51. The intermediate portion 42 is formed from a yieldable resilient material so as to impart spring like characteristics. After the intermediate portion 42 is inserted into the aperture 51, the projecting portion 65 which is sprung inwardly is urged into and abuts the wall 69. The terminal edge portions 63, 64 are urged into and abut the corners 67. The intermediate portion 42 has a substantially uniform cross section with edge portions 63, 64 that are straight. The wedging action results in a firm contact being maintained at the three positions, abutment of the projecting portion 65 and abutment of the terminal portions 63, 64 at each of the corners 67, so as to accurately align and firmly hold the contact in position. The expanded section between the terminal portions 63, 64 within the aperture 51 securely holds contact 10.

The arcuate portion or C-shaped portion 44 depends from the intermediate portion 42. The arcuate portion 44 provides positive electrical contact to the circuit board without generating undue mechanical forces which might damage the coating 15 on the holes 17. A tapered portion 71 between the C-shaped portion 44 and the intermediate portion 42 results in a gradual deflection of the terminal edge portions 63 as the contact 10 is inserted into the circular aperture 17. A tail portion 34 depends from the C-shaped portion and extends external to the printed circuit board 12.

The terms upper, lower, inner, outer and the like are applied only for convenience of description and should not be taken as limiting the scope of this invention.

The contact 10 can be of any suitable material, selected for its spring and electrical conductive properties suitable beryllium copper, or copper alloy. After the intermediate portion 42 is inserted into the aperture 51 it is held in a sprung condition. The configuration of the intermediate portion is such that the spring characteristics can be regulated during manufacture by controlling the thickness of the strip of metal. The contact can be manufactured from a flat stock by proper cutting and bending operations.

The contact 10 is retained by the housing so that circuitry changes may be made. The contact is first removed from the mounting member 30 and the circuit board. The holes 17 are drilled free of plating, and the contact 10 is reinserted. Circuitry changes can then be made by attaching guides such as wire wrapping to the contact tail portion 34. Since it is not necessary for the circuit board to provide the mechanical forces needed to retain the contact in the proper position, the circuit board 13 can have a varying thickness. Defective contacts can be easily removed and new ones press fitted into the circuit board.

While the invention has been described herein with reference to certain examples and preferred embodiments, it is to be understood that various changes and modifications may be made by those skilled in the art without departing from the concept of the invention, the scope of which is to be determined by reference to the following claims.

What is claimed is:

1. An electrical connector for providing electrical connection for one board of the type having conductive strips thereon and another board of the type having a plurality of through holes comprising: a mounting member having a plurality of rectangular apertures therein, each aperture having an end wall and corners facing said end wall; a plurality of electrical contacts, each contact including a flat contact portion at one end for contacting conductive strips on one circuit board, an arcuate C-shaped section at the other end and a portion intermediate said flat contact portion and said C-shaped section, said C-shaped section being tapered outwardly to said intermediate portion, said intermediate portion having a substantially uniform non-linear cross-section including a projecting portion between straight terminal edge portions, said edge portions being sprung outwardly and abutting respective corners and said projecting portion being sprung inwardly and abutting said end wall for accurately aligning and firmly holding said contact to said mounting member, said contacts having respective C-shaped sections projecting outwardly from said mounting member adapted for insertion into respective holes of said other board.

2. An electrical connector according to claim 1 wherein the dimension of the non-linear section from one end of the terminal edge portions to the projecting portion and to the other terminal edge portion corresponds substantially to the dimension from one corner of the rectangular aperature to a point on the end wall to the other of the corners of the rectangular aperture.

3. An electrical connector according to claim 2 including a tail section depending from the arcuate C-shaped section.

4. An electrical connector according to claim 3 wherein said intermediate portion has an arcuate cross-section.

5. An electrical connector and circuit board assembly of the type wherein electrical connection is provided between one board of the type having conductive strips thereon and another board of the type having a plurality of through holes comprising a mounting member having a plurality of apertures therein, said apertures being aligned within substantially a common axially first plane, each aperture having an end wall and corners facing said walls; a plurality of electrical contacts, each contact including a flat contact portion at one end for contacting conductive strips on one circuit board, an arcuate C-shaped section at the other end, and a portion intermediate said flat contact portion and said C-shaped section, said C-shaped section being tapered outwardly to said intermediate portion, said intermediate portion having a substantially uniform non-linear cross-section having a projecting portion between straight terminal edge portions, said edge portions being sprung outwardly and abutting respective corners and said projecting portion being sprung inwardly and abutting said end wall for accurately aligning and firmly holding said contact to said mounting member said other board having a plurality of holes therein lying within a substantially common second axial plane, at least a portion of said holes having an electrically conductive material coated on the inner surface thereof, said first and second planes being substantially parallel, said C-shaped sections of said contacts being disposed in said respective holes.

6. An electrical connector and circuit board assembly according to claim 5 wherein the dimension of the non-linear section from one of the terminal edge portions to the projecting portion and to the other terminal edge portion corresponds substantially to the dimension from one corner of the rectangular aperture to a point on the end wall to the other of the corners of the rectangular aperture.

7. An electrical connector and circuit board assembly according to claim 6 wherein said contact includes a tail section depending from said arcuate shaped section.

8. An electrical board connector and circuit board assembly according to claim 7 wherein said intermediate portion has an arcuate cross-section.

* * * * *